United States Patent [19]
Wade et al.

[11] Patent Number: 5,550,001
[45] Date of Patent: Aug. 27, 1996

[54] LITHOGRAPHIC PRINTING PLATES CONTAINING FUNCTIONAL GROUPS CAPABLE OF REACTING WITH A SILANE COMPOUND

[75] Inventors: John R. Wade; Michael J. Pratt, both of Otley; Robert A. W. Johnstone, Wirral; David I. Smith, Leeds, all of United Kingdom

[73] Assignee: DuPont (U.K.) Limited, Stevenage, United Kingdom

[21] Appl. No.: 238,581

[22] Filed: May 5, 1994

Related U.S. Application Data

[63] Continuation of Ser. No. 953,762, Sep. 29, 1992, abandoned, which is a continuation of Ser. No. 580,813, Sep. 11, 1990, abandoned.

[30] Foreign Application Priority Data

Sep. 12, 1989 [GB] United Kingdom .................. 89/20622

[51] Int. Cl.$^6$ .............................. G03F 7/016; G03F 7/022
[52] U.S. Cl. ...................... 430/157; 430/165; 430/270.1; 430/302; 430/303
[58] Field of Search ...................................... 430/157, 162, 430/175, 176, 190, 192, 193, 303, 315, 165, 270.1, 302

[56] References Cited

U.S. PATENT DOCUMENTS

| 4,613,398 | 9/1986 | Chiong et al. | 430/325 |
|---|---|---|---|
| 4,931,351 | 6/1990 | McColgin et al. | 430/323 |
| 4,981,909 | 1/1991 | Babich et al. | 430/175 |
| 5,008,362 | 4/1991 | Wilharm et al. | 430/175 |
| 5,108,875 | 4/1992 | Thackeray et al. | 430/313 |
| 5,215,867 | 6/1993 | Stillwagon et al. | 430/313 |

OTHER PUBLICATIONS

Follett et al., Extended Abstracts, vol. 82–2, Abstract No. 201, pp. 321–322.

*Primary Examiner*—Charles L. Bowers, Jr.
*Assistant Examiner*—Christopher G. Young
*Attorney, Agent, or Firm*—McAulay Fisher Nissen Goldberg & Kiel, LLP

[57] ABSTRACT

A radiation-sensitive plate comprises a substrate coated with a radiation-sensitive composition including a component having groups imparting solubility in aqueous solutions and a component having functional groups capable of reacting with a silane compound. The surface of the composition is modified by reaction with a silane compound. The plate gives rise to images of improved ink receptivity and can be developed in aqueous developer liquids after image-wise exposure.

8 Claims, No Drawings

LITHOGRAPHIC PRINTING PLATES CONTAINING FUNCTIONAL GROUPS CAPABLE OF REACTING WITH A SILANE COMPOUND

This is a continuation, of application Ser. No. 07/953,762 filed on Sep. 29, 1992, now abandoned, which is a continuation of application Ser. No. 07/580,813 filed Sep. 11, 1990, now abandoned.

FIELD OF THE INVENTION

This invention relates to lithographic printing plates and is concerned with providing such plates with improved printing characteristics.

BACKGROUND OF THE INVENTION

Conventionally lithographic printing plates are produced from radiation-sensitive plates comprising a radiation-sensitive composition coated on a suitable substrate. In use of the radiation-sensitive plate, the coating is image-wise exposed to radiation so that parts of the composition are struck by the radiation and parts are not. The radiation-struck and non-radiation-struck parts have differing solubilities in developer liquids and thus the more soluble parts can be selectively removed by application of such a liquid to leave an image on the substrate constituted by the less soluble parts.

For environmental and health reasons there has been an increasing tendency for wholly aqueous or substantially aqueous based solutions, rather than organic solvents, to be used as the developer liquids. For these solutions to be effective, the radiation-sensitive composition must be soluble, or at least swellable, in such solutions. In the case where the major component of the composition is a polymeric compound it follows that this compound must contain pendant groups such as carboxylic acid groups which render it soluble or swellable in aqueous neutral or alkaline solutions. However, such pendant groups, when present in sufficient quantity in the polymeric compound to provide adequate development when used in a radiation-sensitive composition, tend to cause the image to have high hydrophilicity and lower ink receptivity than is desirable. Reduction of the number of solubilising pendant groups, whilst improving the ink receptivity of the image, causes an unacceptable decrease in the developability of the radiation-sensitive composition in aqueous-based developing liquids.

OBJECTS AND SUMMARY OF THE INVENTION

It is an object of the present invention to provide an improvement in the ink receptivity of images derived from radiation-sensitive compositions that can be developed in water of aqueous alkaline solutions, whilst allowing development to be effected using aqueous based developing liquids.

According to one aspect of the present invention there is provided a radiation-sensitive plate comprising a substrate coated with a radiation-sensitive composition including a component having functional groups capable of reacting with a silane compound and a component having groups imparting solubility in aqueous solutions, wherein the surface of the composition has been modified by reaction of said functional groups with a silane compound of the general formula $$R_n\text{—Si—}X_{4-n}$$

wherein R is H or an alkyl, alkenyl, aryl or aralkyl radical; X is halogen, hydroxy or an alkoxy or aryloxy radical; and n=1 to 3

The alkyl, alkenyl, aryl, aralkyl, alkoxy and aryloxy radicals may be substituted with substituents which do not impair the reaction of the silane with said functional groups or the suitability of the plate for lithographic printing plate manufacture. Examples of such substituents are halogen atoms and amino groups, methacryloxy groups, glycidyloxy groups and mercapto groups.

Preferably the silane compound contains at least one alkyl group having a $C_1$–$C_{20}$ carbon chain, more preferably a $C_8$–$C_{20}$ chain. Examples of suitable compounds include trimethylchlorosilane, dimethyldichlorosilane, ethyltrichlorosilane, octyltrichlorosilane, dimethyloctylchlorosilane, dodecyltrichlorosilane, dimethyldodecylchlorosilane, octadecyltrichlorosilane, dimethyloctadecylchlorosilane, diphenyldichlorosilane, diphenylmethylchlorosilane, dimethyltritylbromosilane, aminopropyltriethoxysilane, methacryloxypropyltrimethoxysilane, and octyltriethoxysilane.

The radiation-sensitive composition includes a component containing solubilising groups, such as sulphonate groups, carboxylic acid groups, sulphonyl carbamate groups, sulphinate groups, phosphonate groups, phenolic groups, amine groups, amide groups, ammonium groups, pyridinium groups, pyrylium groups, thiopyrylium groups, phosphonium groups, diazonium groups, and the like so that the plate can be developed using aqueous developer liquids after image-wise exposure.

The radiation-sensitive composition also includes a component having functional groups capable of reacting with the silane compound so that the desired surface modification can take place. These functional groups are preferably active hydrogen-containing groups such as —OH, —$NH_2$, —$NHR^1$, —SH, —$CO_2H$ and —$CH_2$— groups where $R^1$ is an alkyl group.

The component having groups imparting aqueous solubility and the component having functional groups capable of reacting with the silane compound may be separate components or one and the same component.

The component having such functional groups may be, for example, a synthetic polymer or polymer mixture or other suitable compound which may optionally also include groups imparting aqueous solubility.

Suitable synthetic polymers include those containing hydroxy groups and their reaction products with cyclic anhydrides such as phthalic anhydride in particular. Thus, the synthetic polymer may be a polymer having vinyl alcohol units, such as a partially saponified polyvinyl ester or a polyvinyl acetal having free hydroxyl groups or the corresponding reaction products derived from copolymers having vinyl ester units or vinyl alcohol units or vinyl acetal units such as phthaloylated poly(vinyl butyrals) and toluene sulphonyl isocyanate modified polyvinyl(butyrals). Other examples of modified polymers which may be used are described in GB-A-1370316, DE-A-3404366, JP-A-61-267042, EP-A-0327341, and EP 0371697. Also usable are epoxy resins and saponified epoxy resins; copolymers of allyl alcohol or higher molecular weight unsaturated alcohols; hydroxyacrylic polymers, for example, poly(hydroxyalkyl) (meth)acrylate polymers; phenolic polymers such as phenol formaldehyde resins and vinyl phenol polymers; and other similar polymers. Light sensitive polymers may also be used. Suitable light sensitive hydroxyl containing polymers include diazoterpolymers similar to those exemplified in EP-A- 0233072 but which contain, for example, 2-hydroxyethyl methacrylate as comonomer; poly(vinyl alcohols) reacted with acrylic acid anhydride as described in U.S. Pat. No. 4,517,277; and poly(vinyl butyrals) as for example described in EP-A-0358400 (Example 2).

In addition polymers containing carboxylic acid groups such as copolymers of alkyl (meth)acrylates and (meth)acrylic acid, or sulphonic acid groups and polymers containing primary or secondary amino groups such as polyacrylamide or poly(co-acrylamide-alkyl (meth)acrylates) and polymers such as polysulphides formed by the condensation of sodium polysulphide with bis(2-chloroethyl) formal may be used as polymers containing silane reactive functional groups.

Compounds which include active hydrogen groups capable of reacting with the silane compound and which are other than the above mentioned synthetic polymers may be other components present in the radiation-sensitive composition, for example, radiation-sensitive diazonium compounds having —NH— or —OH groups, surfactants, plasticisers or adhesion promoters.

According to a further aspect of the present invention, there is provided a method of manufacturing a radiation-sensitive plate, which method comprises (i) coating a substrate with a radiation-sensitive composition including a component having functional groups capable of reacting with a silane compound of the formula $R_n$—Si—X4-n where R, X and n have the aforesaid meanings and a component having groups imparting solubility in aqueous solutions, and (ii) contacting the free surface of the composition with said silane compound.

The silane compound may be applied to the surface of the composition by vapour deposition or by deposition of the silane from a solution by whirler coating, roller coating, meniscus coating, dip coating or spraying. In the case of solution deposition, the solvent must be carefully chosen so that it does not a) contain functional groups capable of reacting with the silane compound (such as hydroxy, thio, amino or other active hydrogen groups), or b) dissolve or disturb the radiation-sensitive composition. Preferred solvents include hydrocarbons, such as pentane, hexane, heptane, octane, petroleum spirit mixtures and isoparaffins.

DETAILED DESCRIPTION OF THE INVENTION

The surface modified radiation-sensitive plates of the invention give rise to lithographic printing plates having images with improved printing characteristics whilst still enabling aqueous developer liquids to be used. Thus the images have increased hydrophobicity and ink receptivity, are resistant to blinding and to the effect of solvents, and have superior roll up speed. These improvements can be obtained using plates based on a wide variety of radiation-sensitive materials, well known to those skilled in the art and detailed in 'Chemistry for Graphic Arts' by P. J. Hartsuch and 'Light-sensitive Systems' by J. Kosar. Particularly preferred radiation-sensitive materials are those based on (un)supported diazo compounds, photocrosslinkable polymers, photopolymerisable oligomers, and positive-working quinone diazides, etc.

When exposing radiation-sensitive plates, a montage of films held together by pressure sensitive adhesive tapes is often used. During exposure the adhesive contacts the surface of the plate under pressure and particles of adhesive sometimes remain on the plate surface when the film montage is removed. On development, these particles can act as a barrier and prevent development of the underlying radiation-sensitive composition. Thus, unwanted residues remain in the non-image areas and these deleteriously affect the print quality. It has surprisingly been found that the radiation-sensitive plates of the present invention are less susceptible to this problem.

The following Examples illustrate the invention:

EXAMPLE 1

A solution in ethylene glycol monomethyl ether comprising:

2 parts by weight of a polymer derived from poly(vinyl butyral) and phthalic anhydride, having an acid value of 88.7 mg. KOH $g^{-1}$ 1 part by weight of the diazo compound (41) described in EP-A-030862, and 0.1 parts by weight of Victoria Blue B, was whirler coated onto a sheet of electrochemically grained and anodised aluminium and dried to form a radiation-sensitive plate, Plate (A). The coating weight was 0.8 $gm^{-2}$.

The polymer includes both groups imparting aqueous solubility and groups capable of reacting with a silane compound the polymer derived from poly (vinyl butyral) and phthalic anhydride, had an acid value of 88.7 mg KOH$g^{-1}$ and the following composition:

56.6 mol % poly (vinyl butyral) units 21.0 mol % poly (vinyl alcohol) units 20.0 mol % poly [vinyl(1-carboxybenzoate)] units 2.3 mol % poly (vinyl acetate) units.)

A second radiation-sensitive plate, Plate (B) was made in the same way and was then placed in an enclosed glass chamber. The vapour of octyltrichlorosilane was introduced by warming a small quantity of the liquid silane in a connected glass vessel. The plate surface was exposed to the vapour for 30 minutes to allow the surface to be modified by reaction of the functional groups of the polymer with the silane compound. The plate was then removed.

Both plates were exposed through a continuous tone Stouffer stepwedge to UV light from a metal halide source (450 mJcm$^{-2}$) and developed with an aqueous alkaline (pH 10) developer containing trisodiumphosphate and anionic surfactant. Each plate exhibited rapid and complete development. The developed images of both plates had a stepwedge reading of solid 4, tail 10, but the image areas of Plate (B) were extremely hydrophobic and had very good ink receptivity. In contrast, the image areas of plate (A) were relatively hydrophilic and were reluctant to accept ink. When Plates (A) and (B) were placed on a sheet-fed printing press, Plate (B) produced acceptable copies after four impressions (revolutions of the cylinder) whereas Plate (A) only gave acceptable copies after ten impressions.

EXAMPLE 2

A radiation-sensitive plate was produced in an identical fashion to Plate (A) in Example 1.

A solution of octadecyl trichlorosilane in 2,2,4-trimethylpentane (1.5% v/v) was applied to the surface of the plate by means of a whirler coater rotating at 160 rpm and dried to form a radiation-sensitive plate, Plate (C).

Plate (C) was exposed and developed as described in Example 1, and compared with Plate (A) of Example 1. The image had a stepwedge reading of solid 4, tail 10, was extremely hydrophobic and had good ink receptivity. When placed on a sheet-fed printing press Plate (C) produced acceptable copies after five impressions, whereas Plate (A)

took 11 impressions to achieve copies having a similar ink density.

EXAMPLE 3

Example 2 was repeated except that the silane solution was replaced by a 1.5% v/v solution of dodecyl trichlorosilane in 2,2,4-trimethylpentane. Similar results were obtained.

EXAMPLE 4

Example 2 was repeated except that the diazo compound was replaced by the same weight of the condensation product of 4-diazodiphenylamine and formaldehyde.

Similar results to those described above were obtained.

EXAMPLE 5

Example 2 was repeated except that the silane solution was replaced by a similar solution of octyltriethoxysilane. After whirler coating with the silane compound and drying to form a radiation-sensitive plate, Plate (D), the plate was exposed to the atmosphere for 30 minutes to allow complete hydrolysis of the remaining silyl ether groups. Plate (D) was exposed and developed as described in Example 1 and compared with Plate (A) of Example 1. The image of plate (D) had a stepwedge reading of solid 4, tail 10, and exhibited superior hydrophobicity and ink receptivity to Plate (A).

When placed on a sheet-fed printing press Plate (D) produced acceptable copies after five impressions whereas Plate (A) took ten impressions to achieve copies of similar ink density.

EXAMPLE 6

A positive-working radiation sensitive composition comprising:

6 parts by weight of a naphthoquinone diazide sulphonic acid ester, 27 pbw of a novolak resin, and 0.36 pbw of Sudan Yellow, made up to 400 ml with 95/5 v/v acetone/ethylene glycol monomethyl ether was whirler coated onto electrochemically grained and anodised aluminium and dried at 100° C. for five minutes to give a radiation-sensitive plate with a coating weight of 2.5 gm$^{-2}$ (Untreated plate).

A second plate was prepared identically and a solution of dimethyloctadecylchlorosilane in 2,2,4-trimethylpentane (1.5% v/v) was applied to its surface by means of a whirler coater, rotating at 160 rpm, and dried (Treated plate)

The plates were exposed to UV light from a metal halide source (800 mJcm$^{-2}$) and were dish-developed in 8% sodium metasilicate solution for 45 seconds. Each gave excellent development and stepwedge readings of clear 2, solid 7.

The solvent resistance of the two plates were assessed using a continuous flow of propan-2-ol over the image areas. After seven minutes the image on the silane treated plate remained intact whereas, in the case of the untreated plate, the image had been completely removed. The image on the treated plate had superior hydrophobicity.

EXAMPLE 7

A solution, in methyl ethyl ketone, of:

3 parts by weight of the dimethacrylate ester of diglycidyl ether of bisphenol A, 1 part by weight of the phthalate ester polymer of Example 1, 0.15 parts by weight of 2-(4-chlorophenyl)-4,6-bis-(trichloromethyl)-s-triazine, and 0.15 parts by weight of ethyl Michler's ketone was whirler coated onto a sheet of electrochemically grained and anodised aluminium and dried to form a radiation-sensitive plate of coating weight 1.0 gm$^{-2}$. The plate surface was then exposed to the vapour of octyltrichlorosilane and subsequently overcoated with polyvinyl alcohol to prevent oxygen inhibition.

After exposure through a continuous tone Stouffer stepwedge to UV light (20mJcm$^{-2}$ from a Berkey-Ascor printing down frame) and development with an aqueous solution containing sodium propanoate, sodium benzoate and a surfactant, the ink receptivity of the plate was compared with that of a second plate which was identical except that it had not had the silane surface treatment. Similar results to those of Example 1 were obtained particularly with respect to improved ink receptivity as a consequence of the treatment with octyltrichlorosilane.

EXAMPLE 8

A solution of 1:1 methyl ethyl ketone/ethylene-glycolmonomethylether comprising:

4 parts by weight of the urethane acrylate disclosed as prepolymer A in Example 1 of EP-A-0 260 823, 1 part by weight of a binder resin, namely a phthaloylated polyvinyl butyral, and 0.15 parts by weight of 2-(4'-trichloromethylphenacylidene)- 1,3,3-trimethyl-5-chloroindoline was used to prepare a radiation-sensitive plate as detailed in Example 7 except that the poly(vinyl alcohol) overcoat was omitted. After silane surface treatment, exposure to UV light and development with an aqueous based alkaline developer as described in Example 7, the ink receptivity of the plate was compared with that of an identical plate which had not received the silane treatment and was found to be noticeably superior.

EXAMPLE 9

A solution in 1-methoxy-2-propanol, of 4 parts by weight of the urethane acrylate disclosed as prepolymer A in Example 1 of EP-A-0260823, 1 part by weight of a binder resin, namely a phthaloylated polyvinyl butyral, 0.15 parts by weight of 2-(4'-trichloromethylphenacylidene)- 1,3,3-trimethyl-5-chloroindoline and 0.5 parts by weight of the diazo resin described in Example 1 was used to prepare a radiation-sensitive plate as detailed in Example 8. After silane surface treatment, exposure to UV light and development with an aqueous based alkaline developer as described in Example 7, the ink receptivity of the plate was compared with that of an untreated plate, and found to be noticeably superior.

EXAMPLE 10

A radiation-sensitive plate was produced in an identical fashion to Plate (C) in Example 2, except that octyltrichlorosilane was used in place of octadecyltrichlorosilane.

A piece of pressure-sensitive adhesive masking tape (manufactured by 3M Corporation), on which the adhesive layer had been physically disrupted, was applied to the surface of the plate. On removal of the tape, there was no tendency for any of the adhesive to remain affixed to the plate surface, and on exposure and development, no unwanted residues remained in non-image areas. The image areas were hydrophobic and had good ink receptivity.

A second radiation-sensitive plate was prepared in an identical fashion to plate (A) in Example 1, that is a plate having no surface modification with a silane compound. A piece of pressure-sensitive adhesive tape was prepared and applied in the same way and, on removal, particles of adhesive remained affixed to the plate. These particles were not removed after exposure and development and caused unacceptable ink receptive spots on non-image areas of the plate.

EXAMPLE 11

Example 10 was repeated except that docecyltrichlorosilane was used instead of octyltrichlorosilane.

Similar results were obtained.

We claim:

1. An unexposed lithographic printing plate comprising a substrate coated with a radiation-sensitive composition including a component having functional groups capable of reacting with a silane compound and a component having groups imparting solubility in aqueous solutions, wherein the surface of the composition has been modified by reaction of said functional groups with a silane compound before exposure of the plate to a source of radiation, said silane compound having the general formula $$R_n\text{—Si—}X_{4-n}$$

wherein R is H or an alkyl, alkenyl, aryl, or aralkyl radical; X is halogen, hydroxy or an alkoxy or aryloxy radical; and n=1 to 3 provided that the silane compound includes at least one group R which is an alkyl, alkenyl, aryl or aralkyl radical.

2. An unexposed lithographic printing plate as claimed in claim 1 wherein said groups imparting solubility are sulphonate, carboxylic acid, or sulphonyl carbamate groups.

3. An unexposed lithographic printing plate as claimed in claim 1, wherein the radiation sensitive composition includes a diazo compound, a photocrosslinkable polymer, a photopolymerisable oligomer, or a positive working quinone diazide as radiation sensitive material.

4. An unexposed lithographic printing plate as claimed in claim 1, wherein the component having the functional groups and the component having the groups imparting solubility in aqueous solutions are in the form of a single component having both groups.

5. An unexposed lithographic printing plate as claimed in claim 1 wherein at least one group R is an alkyl group having a $C_8$–$C_{20}$ chain.

6. An unexposed lithographic printing plate comprising
   a substrate; and
   a radiation-sensitive coating on said substrate, said coating including a first component having groups imparting solubility in aqueous developer solutions and a second component at a surface of said coating formed by a reaction between functional groups capable of reacting with a silane compound before exposure of the plate to a source of radiation and a silane compound having the general formula $$R_n\text{—Si—}X_{4-n}$$

wherein R is H or an alkyl, alkenyl, aryl, or aralkyl radical; X is halogen, hydroxy or an alkoxy or aryloxy radical; and n=1 to 3 provided that the silane compound includes at least one group R which is an alkyl, alkenyl, aryl or aralkyl radical.

7. A plate as set forth in claim 6 wherein said groups imparting solubility are sulphonate, carboxylic acid, or sulphonyl carbamate groups.

8. A surface-modified unexposed lithographic printing plate comprising
   a substrate;
   a radiation-sensitive composition coating said substrate, said composition including a first component having groups imparting solubility in aqueous solutions and a second component at a free surface thereof formed by a reaction of functional groups with a silane compound before exposure of the plate to a source of radiation, said silane compound having the general formula $$R_n\text{—Si—}X_{4-n}$$

wherein R is H or an alkyl, alkenyl, aryl, or aralkyl radical; X is halogen, hydroxy or an alkoxy or aryloxy radical; and n=1 to 3 provided that the silane compound includes at least one group R which is an alkyl, alkenyl, aryl or aralkyl radical;
   said composition being capable of exposure to a source of radiation and development in an aqueous solution to form an image area having good ink receptivity.

* * * * *